(12) United States Patent
Aflaki Beni et al.

(10) Patent No.: US 8,466,704 B1
(45) Date of Patent: Jun. 18, 2013

(54) PROBE CARDS WITH MINIMIZED CROSS-TALK

(75) Inventors: Aman Aflaki Beni, San Jose, CA (US); Chung Fu, Sunnyvale, CA (US); Mark Andrew Banke, San Jose, CA (US)

(73) Assignee: Altera Corporation, San Jose, CA (US)

( * ) Notice: Subject to any disclaimer, the term of this patent is extended or adjusted under 35 U.S.C. 154(b) by 369 days.

(21) Appl. No.: 12/763,140

(22) Filed: Apr. 19, 2010

(51) Int. Cl.
*G01R 1/067* (2006.01)

(52) U.S. Cl.
USPC .................................. 324/755.11; 324/755.01

(58) Field of Classification Search
USPC ........................................ 324/755.01–755.11
See application file for complete search history.

(56) References Cited

U.S. PATENT DOCUMENTS

| | | | |
|---|---|---|---|
| 1,880,489 A * | 10/1932 | Roberts ......................... | 152/543 |
| 4,593,243 A | 6/1986 | Lao et al. | |
| 4,636,722 A * | 1/1987 | Ardezzone ............... | 324/750.14 |
| 4,918,383 A * | 4/1990 | Huff et al. ................... | 324/754.2 |
| 5,382,898 A * | 1/1995 | Subramanian ........... | 324/756.03 |
| 5,534,784 A | 7/1996 | Lum et al. | |
| 5,642,054 A | 6/1997 | Pasiecznik, Jr. | |
| 5,959,460 A * | 9/1999 | Johnson ................... | 324/755.01 |
| 6,300,783 B1 * | 10/2001 | Okubo et al. ............ | 324/755.06 |
| 6,727,716 B1 * | 4/2004 | Sharif ....................... | 324/756.03 |
| 6,727,719 B2 * | 4/2004 | Liao et al. .................. | 324/754.2 |
| 7,049,835 B2 * | 5/2006 | Boll et al. ................. | 324/754.07 |
| 7,138,810 B2 * | 11/2006 | Lesher et al. ............. | 324/750.26 |
| 7,170,304 B2 * | 1/2007 | Schaeffer et al. ........ | 324/750.03 |
| 7,521,947 B2 * | 4/2009 | Rogers et al. ............ | 324/755.11 |
| 8,018,242 B2 * | 9/2011 | Nakayama et al. ...... | 324/755.01 |
| 8,305,101 B2 * | 11/2012 | Desta et al. .............. | 324/755.01 |
| 8,310,253 B1 * | 11/2012 | Mardi et al. .............. | 324/754.01 |
| 8,314,624 B2 * | 11/2012 | Kasukabe et al. ........ | 324/750.22 |
| 8,344,747 B2 * | 1/2013 | Kazama et al. .......... | 324/755.01 |
| 2005/0094927 A1 | 5/2005 | Kish, Jr. et al. | |
| 2005/0162177 A1 * | 7/2005 | Chou ............................. | 324/754 |
| 2007/0024302 A1 | 2/2007 | Tervo et al. | |

\* cited by examiner

*Primary Examiner* — Joshua Benitez Rosario
(74) *Attorney, Agent, or Firm* — Treyz Law Group; G. Victor Treyz; David C. Kellogg (57) ABSTRACT

A test probe may have signal and ground probe pins. During testing of an integrated circuit die, the signal and ground probe pins may contact pads on the die. A printed circuit board may have conductive pads and traces that route signals between a tester and the probe pins. The probe pins may be supported by a ring-shaped conductive epoxy support structure. The ground probe pins may be uninsulated within the conductive epoxy support structure, so that the ground probe pins are grounded along their length to the support structure. The signal probe pins may be insulated within the support structure. Coaxial cable shielding may be provided on the signal pins between an outer wall portion of the support structure and the printed circuit board.

19 Claims, 7 Drawing Sheets

PROBE CARDS WITH MINIMIZED CROSS-TALK

BACKGROUND

This relates to testing integrated circuits, and more particularly, to testing integrated circuits with probe cards such as cantilever probe cards.

Integrated circuit manufacturing operations involve testing. Testing may be performed while integrated circuits are in wafer form or after individual die have been packaged.

Packaged die can be tested by placing the die in test sockets. Each test socket has a pattern of contacts that mate with the contacts on a die package. During testing, a test socket that contains a packaged die is connected to a tester. The tester applies power supply and data signals to circuitry on the die through the socket.

This type of arrangement works well for packaged die, but cannot be used with unpacked die because unpackaged die cannot interface with the contacts in the socket.

To enable testing of upackaged die, test systems use test probes. These probes, which are sometimes referred to as probe cards, have probe pins that mate with the exposed contacts on an unpackaged die. Die can be probed using test probes when still in wafer form or after dicing a wafer into individual die.

In a typical arrangement, a wafer of die to be tested is placed on a test stage. The test stage may include a vacuum chuck to hold the wafer in place. The distance between the probe card and the wafer is decreased until the probe pins in the probe card come into contact with mating pads on the surface of the die. A tester that is connected to the probe card can then test the circuitry on the die. Power signals can be applied to the pads of the die through the probe pins. Input test signals can be applied to the die through the probe pins and corresponding output test signals can be gathered through the probe pins.

Integrated circuit die whose pads have a sufficiently wide pitch may be probed using probe cards with vertical pins. Integrated circuit die with more finely spaced pads generally require the use of cantilever probe cards.

In a typical cantilever probe cards, probe pins are angled toward the surface of the die. Because of the way in which the probe pins are mounted within the probe card, the probe pins run parallel to each other and are in close proximity to one another. This type of layout for the probe pins cannot generally be avoided in a cantilever probe card. Unfortunately, at high signal speeds this type of layout can lead to undesired cross-talk due to inductive coupling between nearby pins. Cross-talk effects tend to be additive, so in the presence of numerous high-speed signals there is a significant potential for signal disruption in conventional cantilever probe cards.

It would therefore be desirable to be able to minimize cross-talk in cantilever probe cards and to provide improved test systems with minimized probe card cross-talk effects.

SUMMARY

A test probe may be used to test integrated circuit die. The test probe may have signal and ground probe pins. During testing of an integrated circuit die, the signal and ground probe pins may make electrical contact with contact pads on the die.

Power supply signals and test signals may be provided to the test probe using a tester. The tester may be interconnected with the probe pins using conductive traces and pads on a printed circuit board.

The probe pins may be supported by a ring-shaped conductive epoxy support structure. The ground probe pins may be uninsulated within the conductive epoxy support structure, so that the ground probe pins are grounded along their length to the support structure. The signal probe pins may be insulated within the support structure.

The ring-shaped conductive epoxy support structure may have inner and outer walls. The probe pins may extend from the inner wall towards the die being tested. The probe pins may extend from the outer wall towards the pads and traces on the printed circuit board. Coaxial cable shielding may be provided on the signal pins between the outer wall portion of the support structure and the printed circuit board. The coaxial cable shielding may contain a ground conductor that is soldered to the ring-shaped conductive epoxy support structure.

Further features of the invention, its nature and various advantages will be more apparent from the accompanying drawings and the following detailed description of the preferred embodiments.

DETAILED DESCRIPTION

It is often desirable to test integrated circuits. For example, integrated circuits may be tested during device prototyping. Integrated circuits may also be tested as part of routine manufacturing operations. With this type of arrangement, integrated circuits can be tested to determine if some of the circuits on the device are defective. Any defective blocks of circuitry may then be permanently bypassed by switching redundant circuitry on the integrated circuits into use.

Integrated circuits can be tested after they are packaged. In many situations, however, testing is desired when the integrated circuits are still unpackaged.

Test probes may be used for testing integrated circuits before the integrated circuits are placed in a package. For example, test probes may be used in testing integrated circuit die that are in wafer form. Test probes may also be used in testing integrated circuit die that have been separated from a wafer. Test arrangements in which test probes are used in testing die in wafer form may sometimes be described herein as an example.

Figure 1:
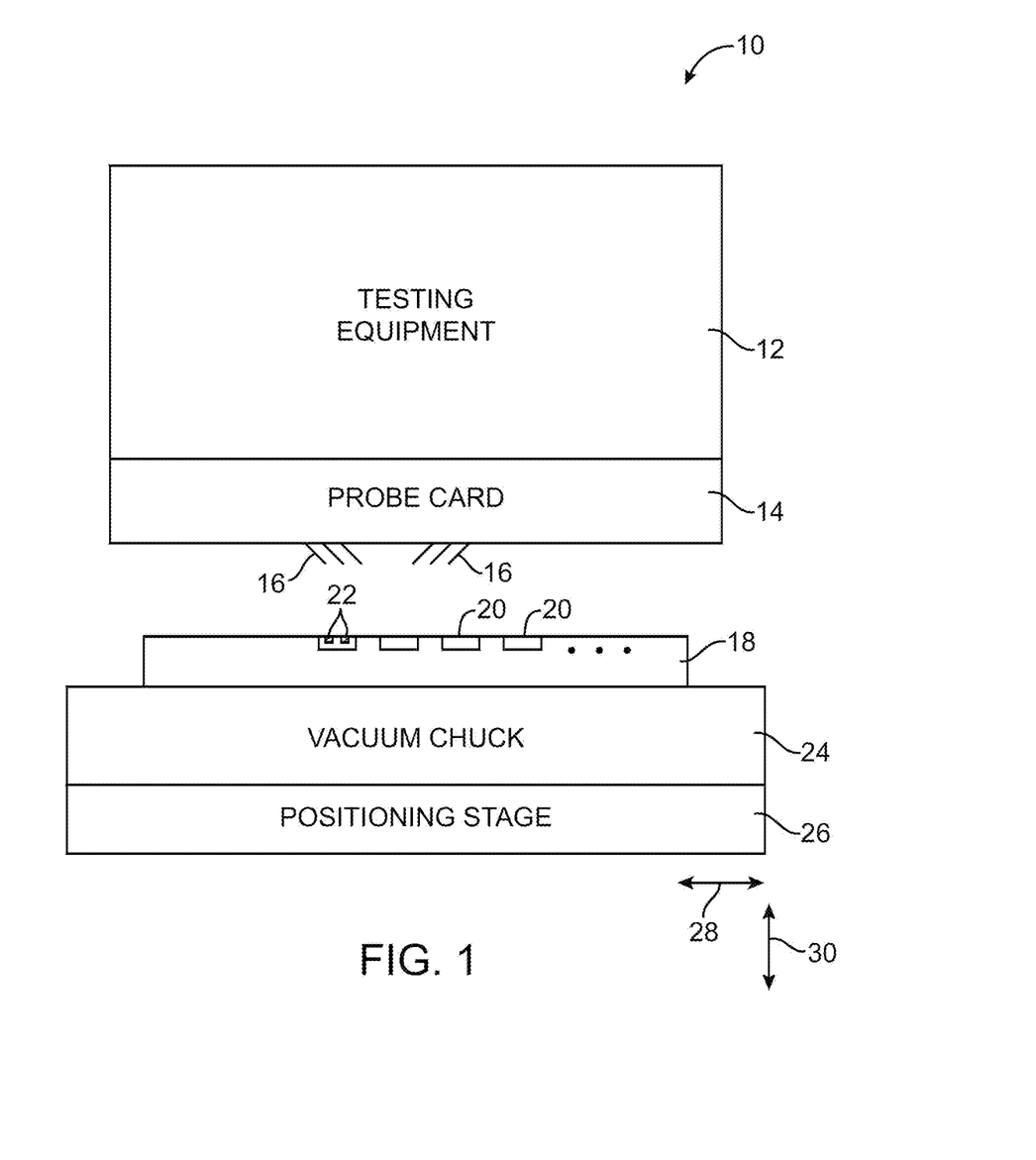
FIG. 1 is a schematic diagram of a test system having a cantilever test probe in accordance with an embodiment of the present invention.

An illustrative test system that may be used to test packaged integrated circuits is shown in FIG. 1. As shown in FIG. 1, test system 10 may include testing equipment 12. Testing equipment 12 may include circuitry for generating test signals and power supply signals. These signals may be applied to integrated circuit die such as die 20 on wafer 18. Testing equipment 12 may also include circuitry for monitoring test signals that are produced by die 20 during testing. Computing equipment such as dedicated processors and general purpose computers may be included within testing equipment 12 or may be connected to testing equipment 12 through a network to support testing operations.

A test probe such as test probe 14 may be used to electrically interconnect the circuitry of testing equipment 12 to the circuitry on integrated circuit die 20. Test probe 14, which may sometimes be referred to as a test head or probe card, may contain numerous probe pins 16. Probe pins 16 may be arranged so that their tips form an array pattern that matches the pattern of contacts 22 (bond pads) on the surface of die 20, when wafer 18 is brought into close proximity of test probe 14. With one suitable arrangement, wafer 18 may be mounted on a vacuum chuck such as vacuum chuck 24. The position of chuck 24 may be controlled in multiple dimensions (e.g., lateral dimensions such as dimension 28 and vertical dimension 30) using positioning stage 26. Testing equipment 12 or other suitable equipment in system 10 may issue control commands for positioning stage 26 during testing. For example, when it is desired to place pins 16 on contacts 22, wafer 18 may be raised upwards by stage 26 towards probe card 14 and pins 16 along vertical axis 30.

Arrangements of the type shown in FIG. 1 in which test probe pins 16 are oriented at non-zero angles with respect to axis 30 are sometimes referred to as cantilever test probes. The use of cantilever probes can be helpful when probing integrated circuit die whose contacts are arranged with a relatively fine pitch.

Figure 2:
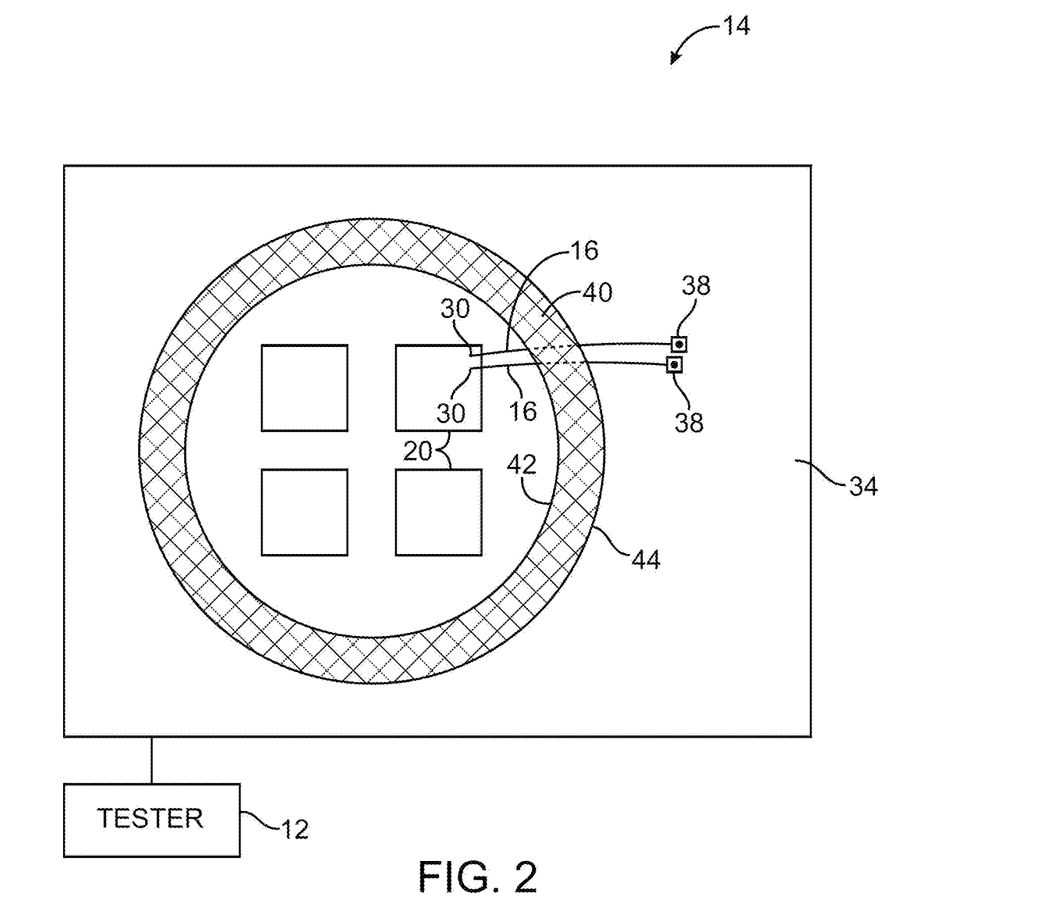
FIG. 2 is a top view of a test probe in a test system in accordance with an embodiment of the present invention.

FIG. 2 is a top view of an illustrative cantilever test probe that may be used in a test system such as test system 10 of FIG. 1. As shown in FIG. 2, cantilever test probe 14 may be connected to test equipment 12. Test equipment 12 may be used in generating power and data signals for testing the circuitry on die 20 and may be used in gathering corresponding test results.

Probe pins 16 may be supported using a support structure such as ring-shaped support structure 40. Structure 40 may have an inner vertical wall along circular inner edge 42 and outer vertical wall along circular outer edge 44. Pins 16 may protrude through support structure 40. With one suitable arrangement, support structure 40 may be formed from a liquid adhesive such as conductive epoxy. During fabrication of test probe 14, probe pins 16 may be placed in desired positions and covered with a layer of the conductive epoxy. When the conductive epoxy cures and solidifies, probe pins 16 are retained in their desired locations. The conductive epoxy may be cured using room temperature curing, elevated temperature curing, ultraviolet light exposure, or other suitable curing techniques. Other materials such as other liquid adhesives (e.g., other conductive liquid adhesives) may be used in forming support structure 40 if desired.

As shown in FIG. 2, tips 30 of probe pins 16 may be placed on the surface of die 20 (i.e., in alignment with pads 22 of FIG. 1). There are typically hundreds or thousands of contact pads on each die 20 and a corresponding number of probe pins 16. Only two probe pins 16 are shown in FIG. 2 to avoid overcomplicating the drawing.

The contact pads on die 20 may be arranged in any suitable pattern. In a typical arrangement, a respective bank of staggered contact pads runs along each die edge. Support structure 40 may be constructed using one or more layers of conductive epoxy, each of which is layered upon the next to support a respective layer of pins 16. There may be, for example, three layers of pins 16. The layering of pins 16 in test probe 14 may help ensure that tips 30 of test pins 16 can reach all desired contact pads in die 20. If desired, multiple die can be probed simultaneously using the same test probe. For example, probe pins 16 in test probe 14 can be arranged so that the contact pads along the edges of four die (i.e., the die 20 shown in the center of support ring 40 of FIG. 2) are all contacted simultaneously.

Probe pins 16 may be interconnected with tester 12 using traces in a substrate such as printed circuit board 34. Printed circuit board 34 may contain multiple layers. Patterned traces in these layers may be used to route data signals and power signals between die 20 and tester 12. The patterned traces in board 34 may be provided on the front and back sides of printed circuit board 34 and/or may be provided in internal layers in printed circuit board 34. As shown in FIG. 2, printed circuit board 34 may have contact pads such as contact pads 38 to which pins 16 are electrically connected using solder joints (as an example).

Figure 3:
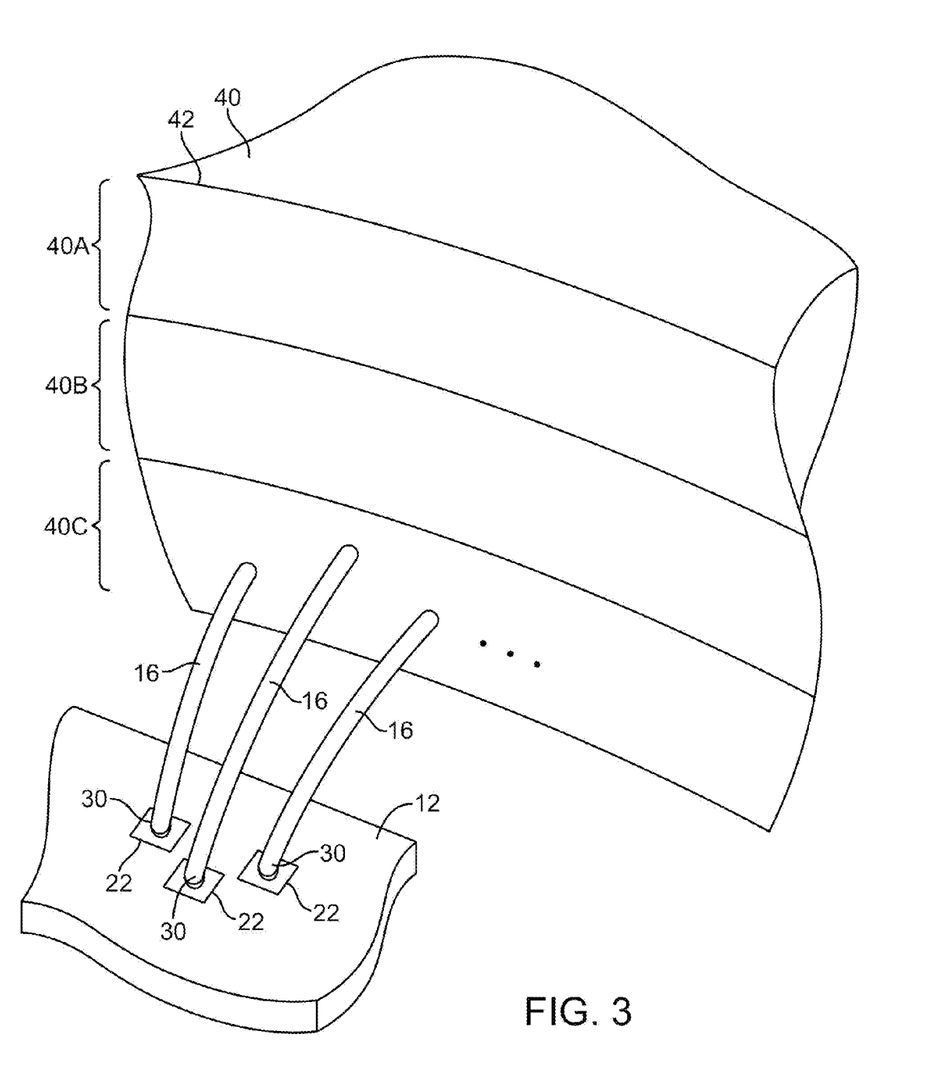
FIG. 3 is a perspective view of probe pins in a test probe in accordance with an embodiment of the present invention.

A perspective view of support structure 40 of test probe 14 showing the inner wall of the support structure along edge 42 is shown in FIG. 3. As shown in FIG. 3, support structure 40 may have multiple layers of conductive epoxy such as layers 40A, 40B, and 40C. Probe pins 16 exit the inner wall of structure 40 and protrude inwardly toward die 12, so that tips 30 contact pads 22. Pads 22 may be arranged in staggered rows as shown in FIG. 3. The pad-to-pad pitch within each row may be about 60 µm (as an example). The pad size may be about 40 µm by 40 µm (as an example). The outer and inner rows of pads may be about 30 µm apart (as an example).

Conventional cantilever probes have probe pin support structures that are formed from epoxy that is not conductive. This can lead to situations in which excessive cross-talk develops between the probe pins in the probe.

Figure 4:
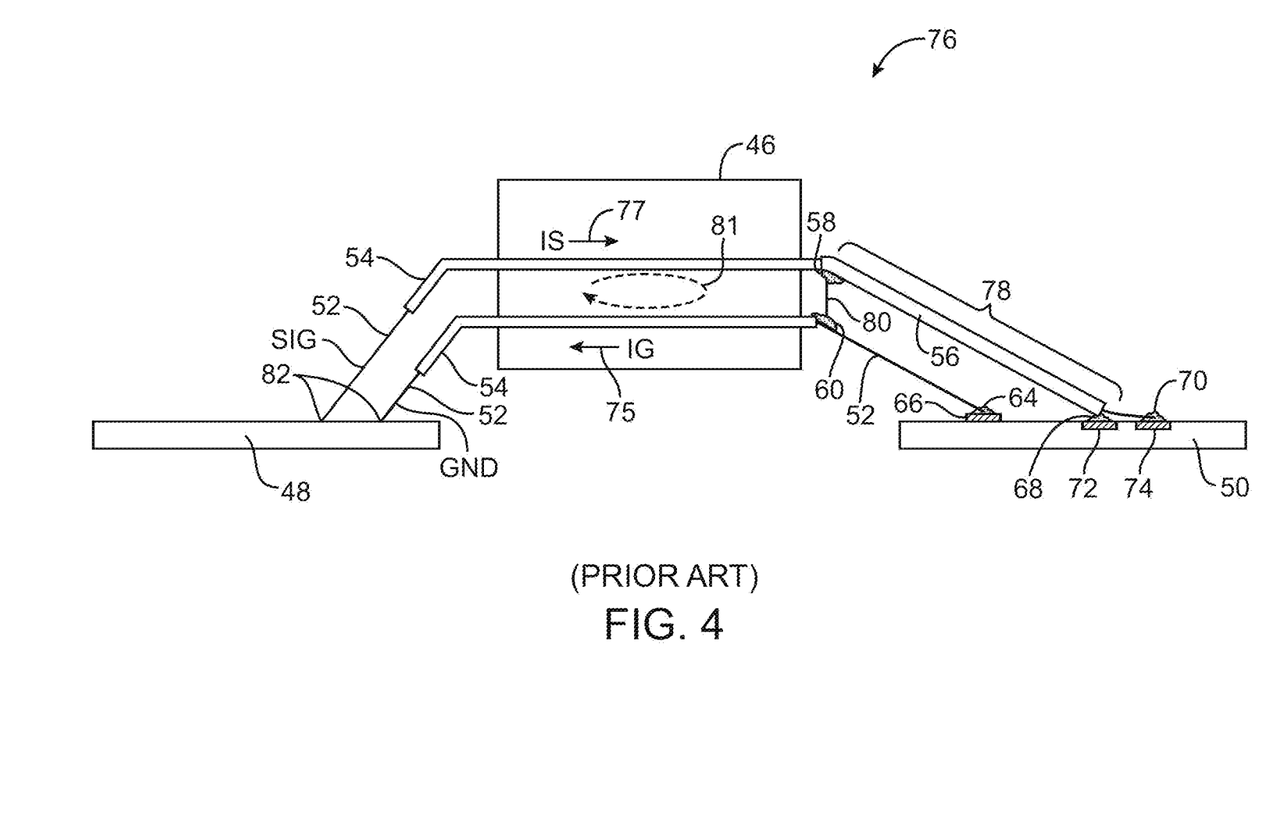
FIG. 4 is a cross-sectional side view of a conventional probe card arrangement showing how current loops may arise that produce electromagnetic fields and cross talk.

This problem is illustrated in the cross-sectional side view of a conventional cantilever probe that is shown in FIG. 4. As shown in FIG. 4, conventional probe 76 has a printed circuit board (board 50) that contains interconnect traces and pads 66, 72, and 74. The interconnect traces and pads of printed circuit board 50 are used to connect probe pins 52 to a tester. Tips 82 of probe pins 52 contact pads on die 48 during testing.

With arrangements of the type shown in FIG. 4, a first of pins 52 (i.e., a ground pin) may be connected to ground pad 66 on printed circuit board 50 using solder 64 and a second of pins 52 (i.e., a signal pin) may be connected to signal pad 74 on printed circuit board 50 using solder 70. Signal pins may have associated coaxial cable shields such as shield 56 on the segment of the signal pin that extends between printed circuit board 50 and epoxy ring 46 (i.e., on segment 78 of the signal pin in FIG. 4).

The outer braid conductor in the coaxial cable shield may be grounded to ground pad 72 using solder 68. At the other end of segment 78, the outer braid conductor of the coaxial cable shield of the signal pin is grounded to the ground probe pin using solder connection 58, wire 80, and solder connection 60.

Each probe pin in conventional test probe 76 has an associated insulating coating (insulating coatings 54). The coating is removed from the ends of probe pins 52 near tips 82 and, on ground pin GND, is removed at solder joint 60. In signal pin SIG, insulating coating extends to coaxial cable segment 78. The signal wire in signal probe pin SIG extends from tip 82 to pad 74 through coaxial shield segment 78.

During testing, return current IG (i.e., ground current IG) may flow in the ground probe pin GND in direction 75, while signal current IS may flow in the signal probe pin SIG in direction 77, giving rise to current loop 81 and induced electromagnetic fields. The electromagnetic fields that are created by this loop can be coupled into nearby signal loops through insulating epoxy support 46 (which is a dielectric), leading to undesirable cross-talk.

Figure 5:
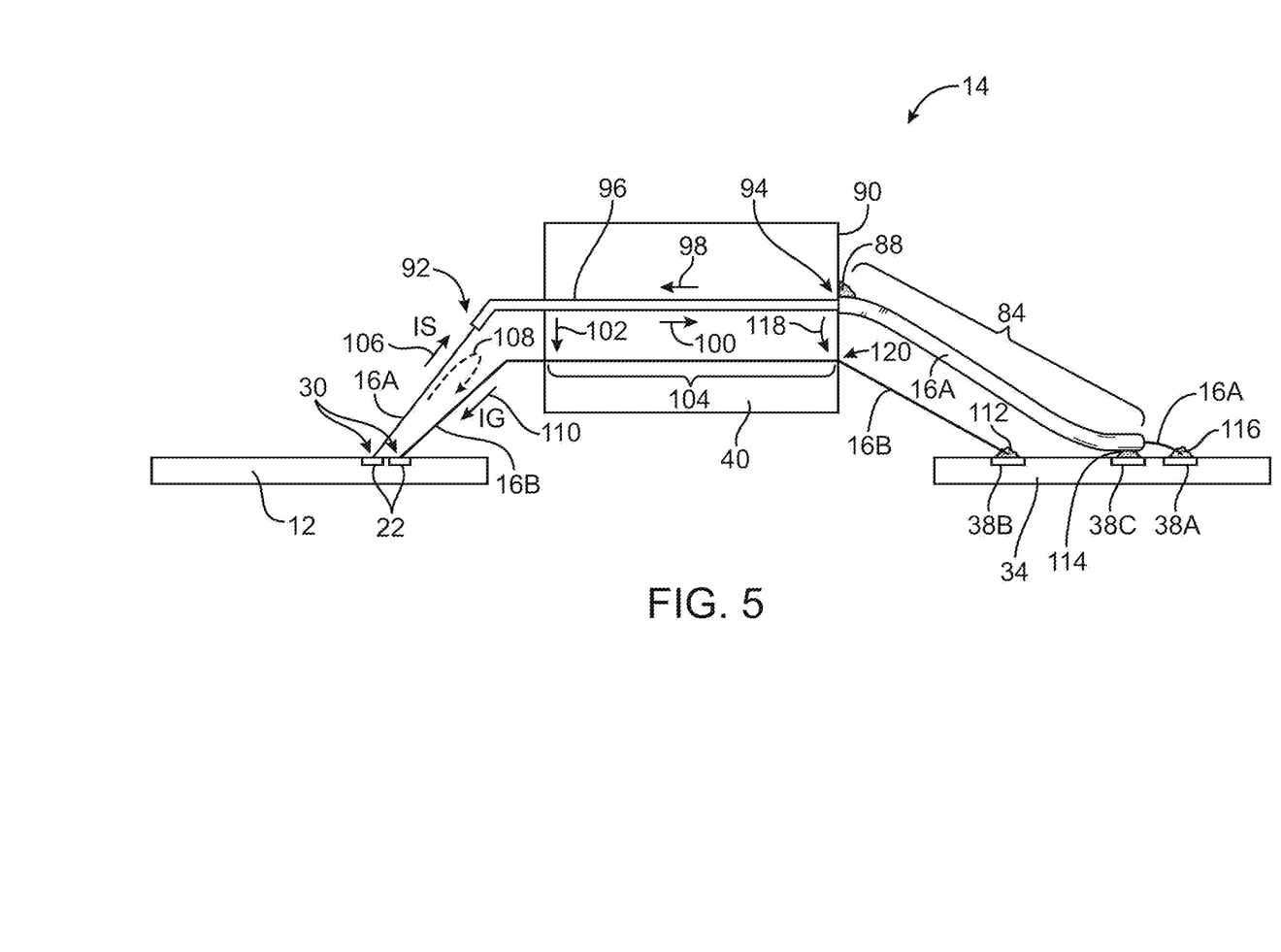
FIG. 5 is a cross-sectional side view of an illustrative test probe in accordance with an embodiment of the present invention.

A test probe arrangement that may be used to reduce cross talk for a test system of the type shown in FIG. 1 is shown in FIG. 5. In test probe 14 of FIG. 5, probe pin 16A is used to carry a test data signal between die 12 and printed circuit board 34 and ground probe pin 16B is used to carry a ground signal. At tips 30, probe pins 16A and 16B contact pads 22 on integrated circuit die. At printed circuit board 34, probe pins 16A and 16B are electrically connected to the pads on printed circuit board 34. In particular, probe pin 16B is soldered to ground pad 38B using solder 112 and the center signal conductor in coaxial shield portion 84 of probe pin 16A is connected to signal pad 38A using solder 116. The outer ground conductor of coaxial cable segment 84 of pin 16A may be grounded to ground pad 38C using solder 114. At the other end of coaxial cable shield segment 84, the outer ground conductor of coaxial cable shield segment 84 may be soldered to surface 90 of conductive epoxy support 40 using solder 88.

Ring-shaped probe pin support structure 40 may be formed from one or more layers of conductive epoxy (e.g., three layers such as layers 40A, 40B, and 40C of FIG. 3). Within support 40 and along the rest of the length of ground probe pin 16B, ground probe pin 16B may be uncoated with insulator (i.e., probe pin 16B may be bare of insulation and therefore uninsulated). This allows the entire length of probe pin 16B that lies within support structure 40 (i.e., segment 104) to be electrically grounded to support structure 40 and the other ground structures in test probe 14 such as solder connection 88 and the associated outer conductor of shield segment 84 of pin 16A. Signal probe pins such as signal probe pin 16A may be provided with an insulating coating (insulator 96) that prevents the signal probe pin conductor (i.e., the conductor at tip 30 of probe 16A and the integrally formed central inner signal conductor in shield segment 84) from being shorted to conductive support structure 40. During operation, signal current in the signal probe flows in direction 100 in the conductor inside insulating coating 96, while return current (i.e., ground current) flows in opposite direction 98 in portions of support 40 immediately adjacent insulating coating 96. Large current loops inside structure 40 such as current loop 81 of conventional test probe 76 of FIG. 4 are therefore avoided. A small current loop such as current loop 108 may arise because signal current IS is flowing in direction 106 in signal probe pin 16A while return current IG is flowing in direction 110 in ground probe pin 16B (current 102 in structure 40 forms part of the loop), but loops such as loop 108 tend to be smaller and less likely to lead to inductive coupling and cross talk than loops such as loop 81 in conventional arrangements. Test probes such as test probe 14 therefore tend to exhibit minimized cross talk relative to conventional test probes.

As shown in FIG. 5, ground path 118 is formed between solder joint 88 and point 120 on ground probe pin 16B through the interior of conductive support structure 40, obviating the need for external ground wires such as ground wire 80 of FIG. 4 and their associated solder connections.

Figure 6:
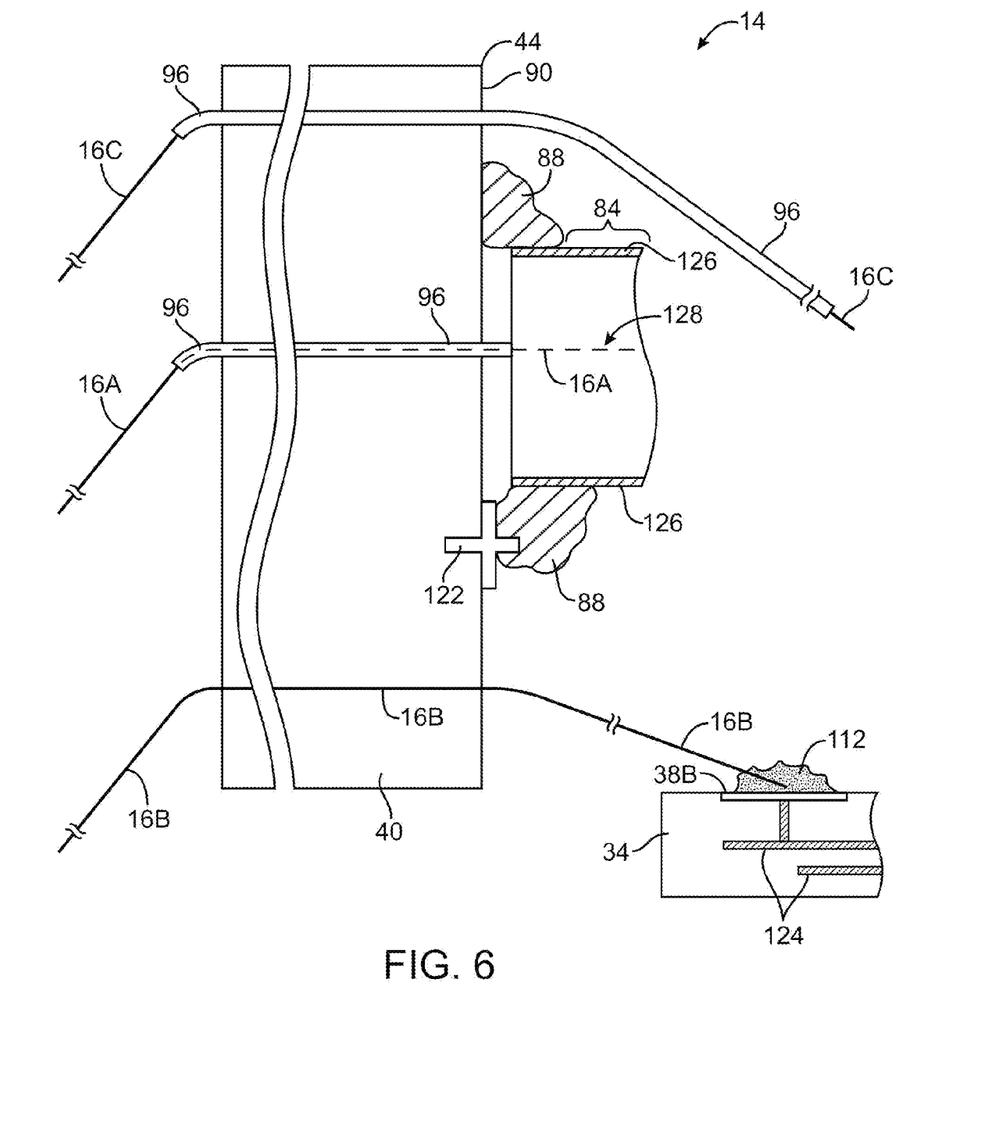
FIG. 6 is a cross-sectional side view of a conductive epoxy structure of the type that may be used in supporting probe pins in a test probe in accordance with an embodiment of the present invention.

A cross-sectional side view of test probe 14 in the vicinity of conductive epoxy support structure 14 is shown in FIG. 6. As shown in FIG. 6, some probe pins such as signal probe pin 16C (e.g., a low-frequency or direct-current pin) may not be provided with coaxial cable shielding. Other probe pins such as signal probe pin 16A may be provided with coaxial shielding segment 84 (between outer wall 90 and the pads on the printed circuit board). Solder 88 may be used to solder outer braid conductor 126 of coaxial cable segment 84 to support structure 40. If desired, conductive structures such as conductive structure 122 (i.e., a metal terminal) may be used to facilitate attachment of solder 88 to conductive support 40. Center conductor 128 may extend as a unitary wire piece between the die and printed circuit board 34. As shown in the cross-section of board 34 in FIG. 6, the internal layers of board 34 may contain internal conductors 124 such as conductive vias and conductive internal traces for ground and signal paths.

Figure 7:
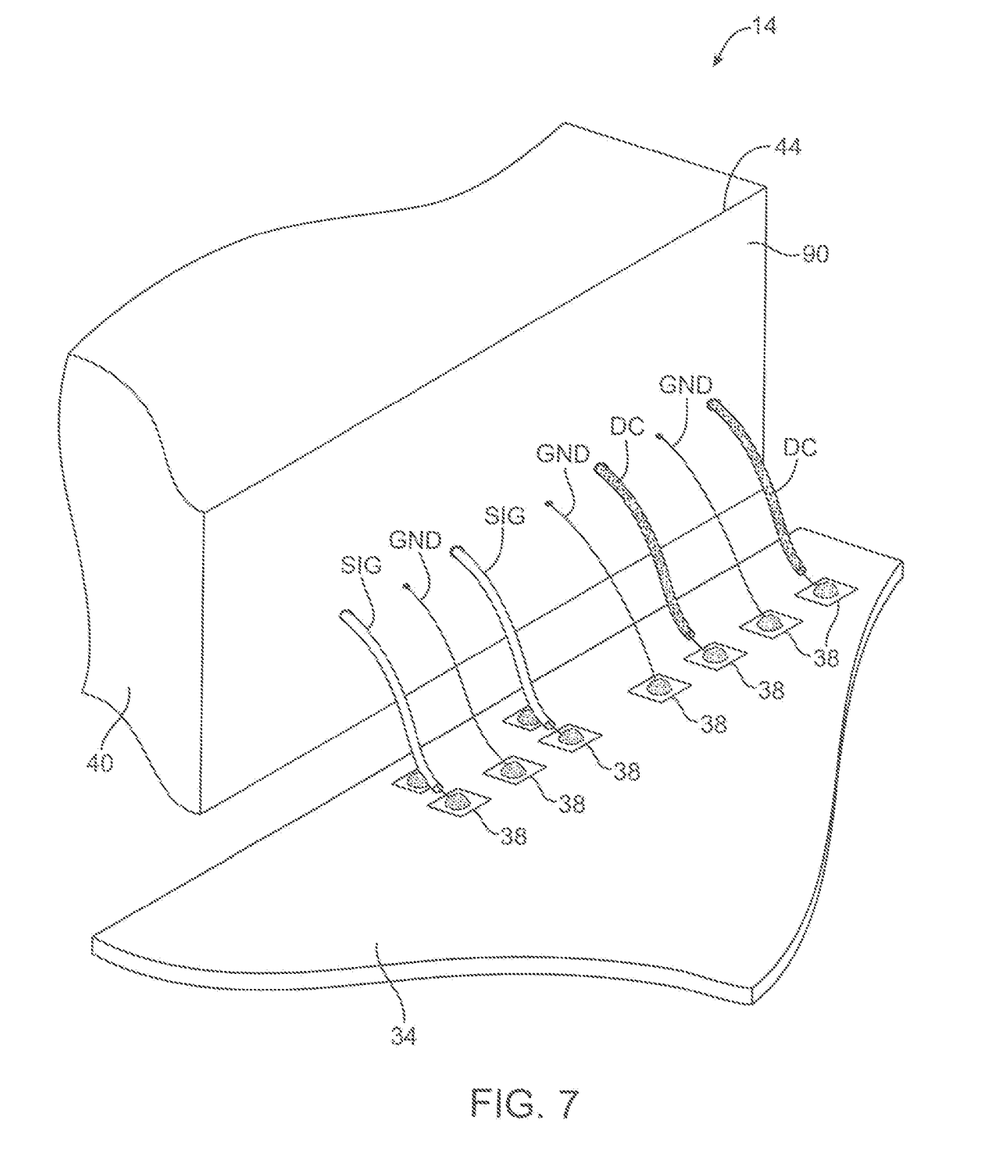
FIG. 7 is a perspective view of an outer portion of a conductive epoxy ring that is being used to support probe pins in a test probe in accordance with an embodiment of the present invention.

A perspective view of test probe 14 of FIG. 7 showing outer wall 90 of conductive ring-shaped support structure 40 is shown in FIG. 7. As shown in FIG. 7, a variety of different pins may be used in the same test probe. Some of the pins may be ground pins (GND). These pins are shorted to conductive support structure 40 along the portions of their lengths that run within conductive support structure 40. Other pins may be used for signals. High frequency signals can be routed through signal pins with coaxial cable shields (see, e.g., pins SIG). Lower frequency data signals and power signals (sometimes referred to as DC signals) can be routed through paths that are coated with an insulating layer (probe pins DC in FIG. 7). Any suitable pattern may be used in locating probe pins within conductive support structure 40. For example, signal pins can be clustered around ground pins, signal and ground pins can be alternated, etc.

The foregoing is merely illustrative of the principles of this invention and various modifications can be made by those skilled in the art without departing from the scope and spirit of the invention.

What is claimed is:

1. A test probe, comprising:
   a conductive probe pin support structure having a plurality of layers; and
   a plurality of layers of probe pins that pass through the conductive probe pin support structure, wherein each layer of the layers of probe pins is located between a respective pair of layers of the plurality of layers of the conductive probe pin support structure.

2. The test probe defined in claim 1 wherein the conductive probe pin support structure comprises conductive adhesive.

3. The test probe defined in claim 2 wherein the conductive adhesive comprises conductive epoxy.

4. The test probe defined in claim 3 wherein the conductive probe pin support structure has a ring shape.

5. The test probe structure defined in claim 1 wherein, in each layer of the layers of probe lines, the probe pins of that layer comprise signal probe pins and ground probe pins and wherein the ground probe pins are uncovered by insulator within the conductive probe pin support structure.

6. The test probe structure defined in claim 5 wherein the signal probe pins are coated with an insulator within the conductive probe pin support structure.

7. The test probe defined in claim 6 further comprising:
   a printed circuit board to which the probe pins are connected; and
   a plurality of coaxial cable shields each of which is located over a respective segment of one of the signal probe pins.

8. The test probe defined in claim 7 wherein the coaxial cable shields have outer ground conductors that are shorted to the conductive probe pin support structure.

9. The test probe defined in claim 8 wherein the conductive probe pin support structure comprises conductive epoxy.

10. The test probe defined in claim 9 wherein the conductive probe pin support structure has a ring shape.

11. A test probe, comprising:
a conductive ring-shaped support structure, wherein the conductive ring-shaped support structure lies in a plane;
a least one probe pin that is uncovered by insulator within the conductive ring-shaped support structure, wherein the conductive ring-shaped support structure has a plurality of layers of conductive epoxy and wherein the layers of conductive epoxy are stacked together in a vertical direction perpendicular to the plane.

12. The test probe defined in claim 11 further comprising a least one probe pin that is covered by insulator within the conductive ring-shaped support structure.

13. The test probe defined in claim 12 wherein the conductive ring-shaped support structure has an inner wall from which the probe pins extend and has an outer wall from which the probe pins extend.

14. The test probe defined in claim 13 further comprising a printed circuit board with pads, wherein at least some of the pads are connected to portions of the probe pins that extend from the outer wall.

15. A cantilever test probe comprising:
a conductive support structure;
a plurality of insulated probe pins that pass through the conductive support structure; and
a plurality of uninsulated probe pins that pass through the conductive support structure, wherein at least some of the insulated probe pins and at least some of the uninsulated probe pins pass through the conductive support structure along a first plane and wherein at least some of the insulated probe pins pass through the conductive support structure along a second plane above the first plane.

16. The cantilever test probe defined in claim 15 wherein the uninsulated probe pins comprise ground probe pins, wherein the insulated probe pins comprise signal probe pins, and wherein at least some of the signal probe pins each have a segment covered with coaxial cable shielding.

17. The cantilever test probe defined in claim 16 wherein the coaxial cable shielding comprises an outer ground conductor that is electrically shorted to the conductive support structure.

18. The cantilever test probe defined in claim 17 wherein the conductive support structure comprises a ring-shaped conductive epoxy structure.

19. The cantilever test probe defined in claim 18 wherein the outer ground conductor is soldered to a surface of the ring-shaped conductive epoxy structure.

* * * * *